US012685158B2

(12) United States Patent
Goto et al.

(10) Patent No.: US 12,685,158 B2
(45) Date of Patent: Jul. 14, 2026

(54) HEAT DISSIPATION MEMBER

(71) Applicant: DENKA COMPANY LIMITED, Tokyo (JP)

(72) Inventors: Daisuke Goto, Tokyo (JP); Hiroaki Ota, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 108 days.

(21) Appl. No.: 18/698,607

(22) PCT Filed: Oct. 3, 2022

(86) PCT No.: PCT/JP2022/036939
§ 371 (c)(1),
(2) Date: Apr. 4, 2024

(87) PCT Pub. No.: WO2023/058597
PCT Pub. Date: Apr. 13, 2023

(65) Prior Publication Data
US 2024/0413051 A1      Dec. 12, 2024

(30) Foreign Application Priority Data

Oct. 6, 2021      (JP) ................................. 2021-164568

(51) Int. Cl.
*H10W 40/25*          (2026.01)
*H05K 7/20*           (2006.01)
(Continued)

(52) U.S. Cl.
CPC ........ *H10W 40/253* (2026.01); *H05K 7/2039* (2013.01); *H10W 40/611* (2026.01); *H10W 90/00* (2026.01)

(58) Field of Classification Search
CPC ............. H01L 23/4006; H01L 23/3738; H01L 25/0655; H05K 3/0061
See application file for complete search history.

(56) References Cited

U.S. PATENT DOCUMENTS

| 5,536,972 A | * | 7/1996 | Kato | ................... H01L 23/3121 |
| | | | | 257/E23.125 |
| 6,122,170 A | * | 9/2000 | Hirose | .................. C04B 37/026 |
| | | | | 174/16.3 |

(Continued)

FOREIGN PATENT DOCUMENTS

| CN | 106952875 A | 7/2017 |
| JP | 2002-299532 A | 10/2002 |

(Continued)

OTHER PUBLICATIONS

European Patent Office, Extended European Search Report issued in European Application No. 22878466.6 (Jan. 22, 2025).

(Continued)

*Primary Examiner* — Nelson J Nieves

(74) *Attorney, Agent, or Firm* — Leydig, Voit & Mayer, Ltd.

(57)                ABSTRACT

Provided is a heat dissipation member according to the present invention that includes a flat metal-silicon carbide composite containing aluminum, the heat dissipation member including: at least one through hole that penetrates the flat metal-silicon carbide composite in a plate thickness direction; a tapered portion where an inner diameter of the through hole gradually increases toward an outer side in a periphery of one or both end portions of the through hole; a metal portion containing aluminum that is formed on an inner surface of the through hole; and a screw hole that is formed in the metal portion.

9 Claims, 6 Drawing Sheets

(51) Int. Cl.
    *H10W 40/60*        (2026.01)
    *H10W 90/00*        (2026.01)

(56)                 References Cited

U.S. PATENT DOCUMENTS

| | | | |
|---|---|---|---|
| 6,188,579 B1 * | 2/2001 | Buondelmonte | ... H01L 23/3677 257/E23.105 |
| 6,222,264 B1 * | 4/2001 | O'Neal | H01L 23/42 257/714 |
| 7,582,959 B2 | 9/2009 | Fukusako | H05K 3/0061 257/E23.079 |
| 8,237,260 B2 * | 8/2012 | Tschirbs | H05K 1/142 438/109 |
| 11,903,168 B2 * | 2/2024 | Ishihara | H05K 7/2039 |
| 2004/0022029 A1 * | 2/2004 | Nagatomo | H01L 23/3736 361/709 |
| 2004/0241447 A1 * | 12/2004 | Fukushima | C04B 41/81 428/408 |
| 2008/0122052 A1 * | 5/2008 | Fukui | H01L 23/3731 257/E23.113 |
| 2009/0280351 A1 * | 11/2009 | Hirotsuru | C22C 1/051 428/613 |
| 2010/0053961 A1 * | 3/2010 | Mo | H05K 9/0067 362/249.01 |
| 2010/0053962 A1 * | 3/2010 | Mo | H05K 3/0061 362/249.01 |
| 2011/0227122 A1 * | 9/2011 | Lin | H01L 23/3677 257/E33.066 |
| 2012/0050997 A1 * | 3/2012 | Chen | H01L 23/36 361/711 |
| 2013/0009301 A1 * | 1/2013 | Iwayama | C22C 23/00 428/545 |
| 2013/0062717 A1 * | 3/2013 | Watanabe | H05K 1/0201 257/431 |
| 2015/0217529 A1 * | 8/2015 | Nagasaka | H01L 23/4006 100/211 |
| 2017/0142859 A1 * | 5/2017 | Miyakawa | C04B 35/565 |
| 2017/0170096 A1 * | 6/2017 | Hironaka | H01L 23/433 |
| 2018/0215668 A1 | 8/2018 | Yuasa et al. | |
| 2021/0269697 A1 | 9/2021 | Goto et al. | |
| 2022/0124936 A1 | 4/2022 | Ishihara et al. | |
| 2023/0352354 A1 * | 11/2023 | Kondo | H01L 25/50 |

FOREIGN PATENT DOCUMENTS

| | | |
|---|---|---|
| JP | 2008-240155 A | 10/2008 |
| JP | 2012-254891 A | 12/2012 |
| JP | 2020-012194 A | 1/2020 |
| WO | WO 2017-022012 A1 | 2/2017 |
| WO | WO 2020-013300 A1 | 1/2020 |
| WO | WO 2020-110824 A1 | 6/2020 |

OTHER PUBLICATIONS

Japan Patent Office, International Search Report issued in International Application No. PCT/JP2022/036939 (Nov. 29, 2022).

* cited by examiner

[Fig.1]
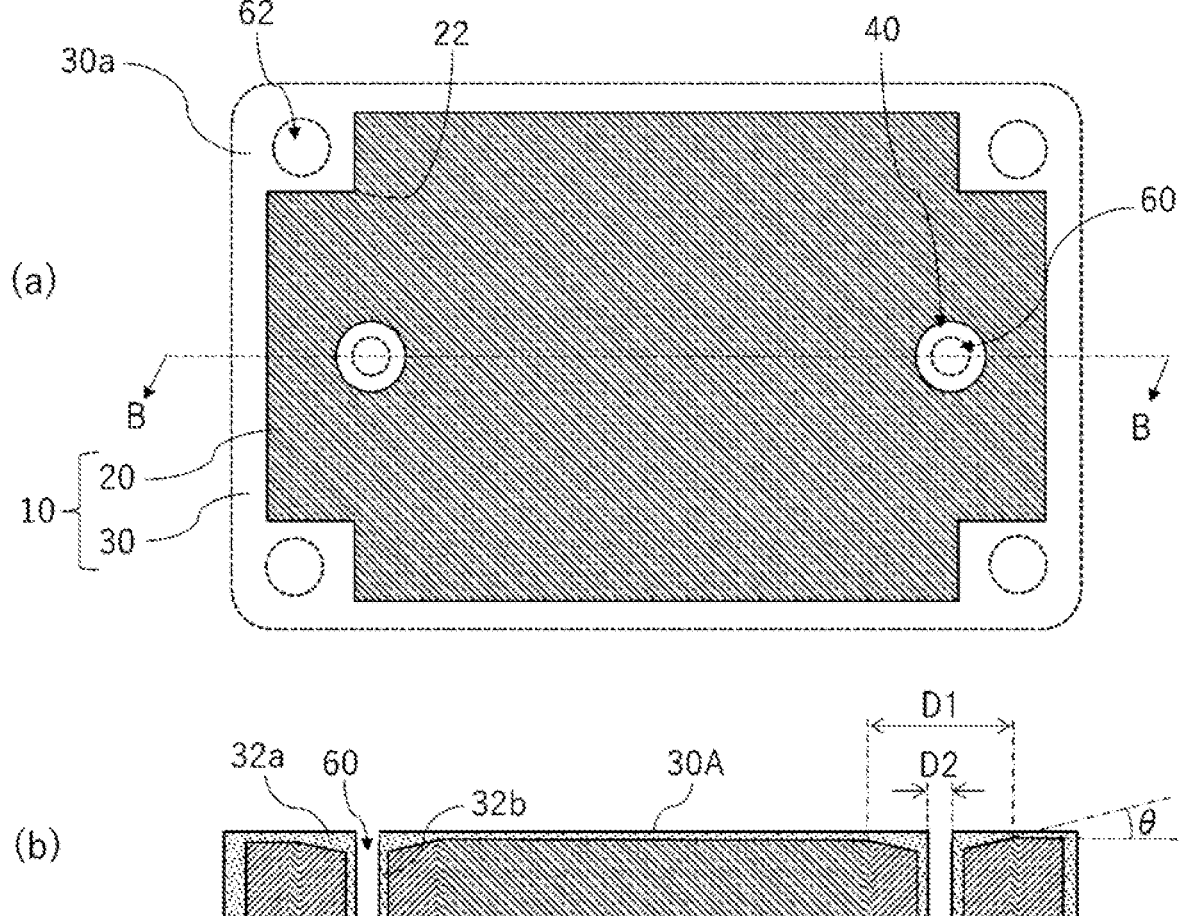

[Fig.2]
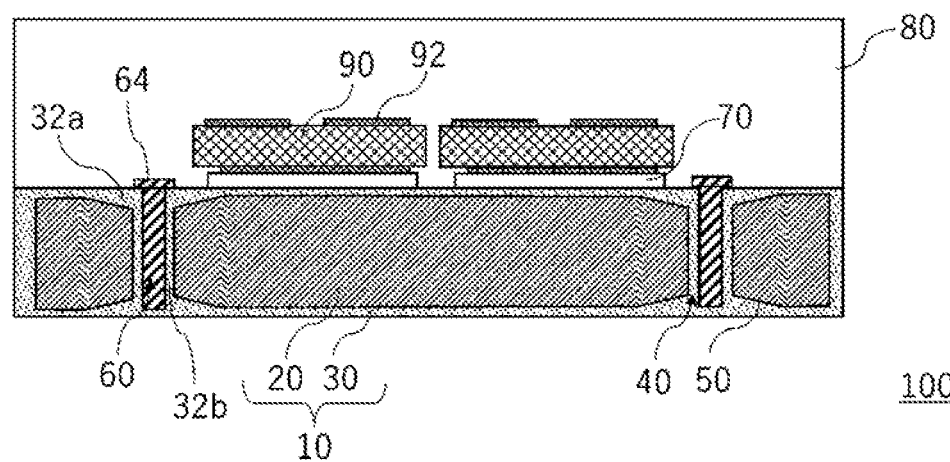
100

[Fig.3]
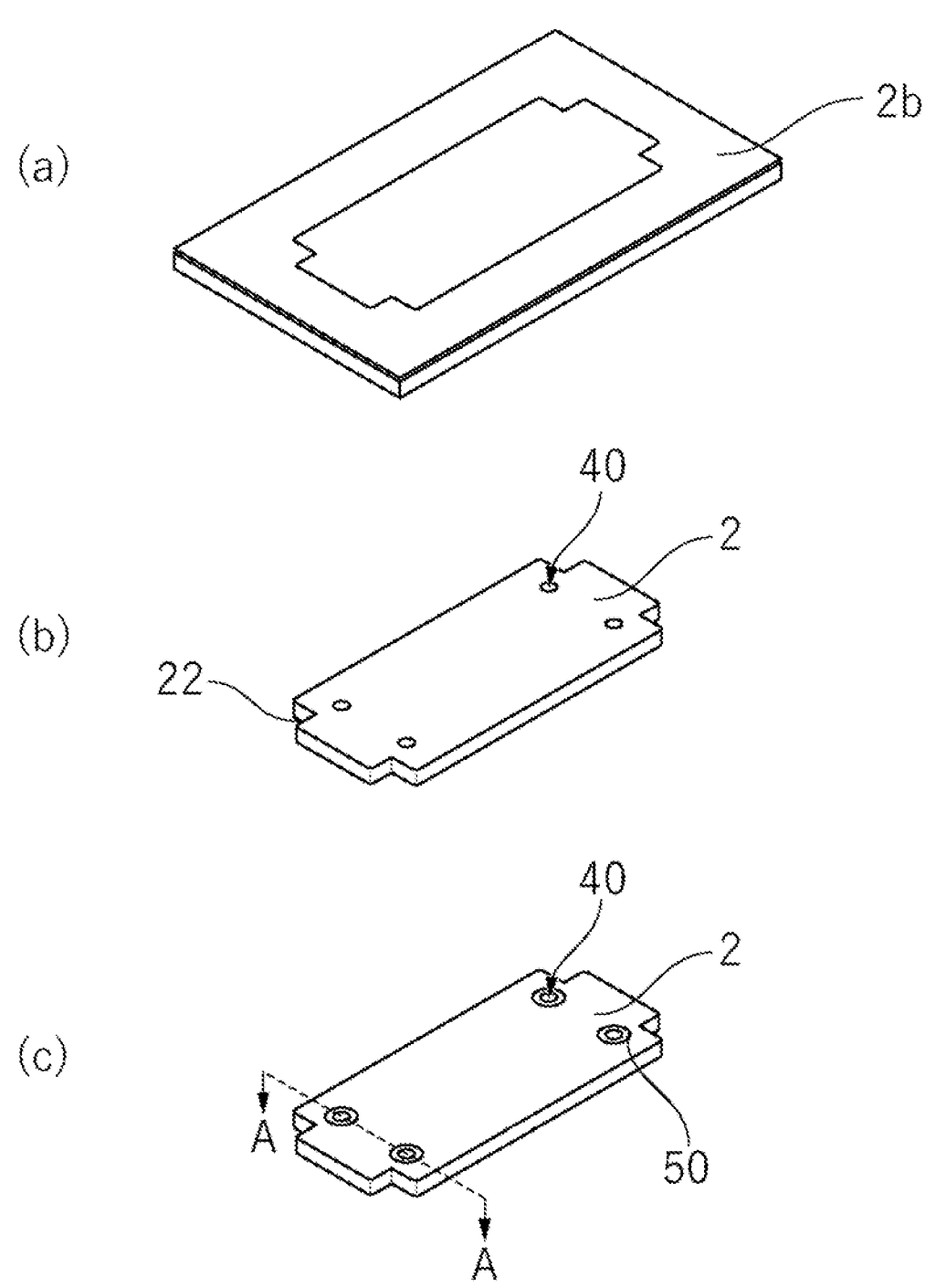
(a)
2b
(b)
40
2
22
(c)
40
2
50
A
A

[Fig.4]
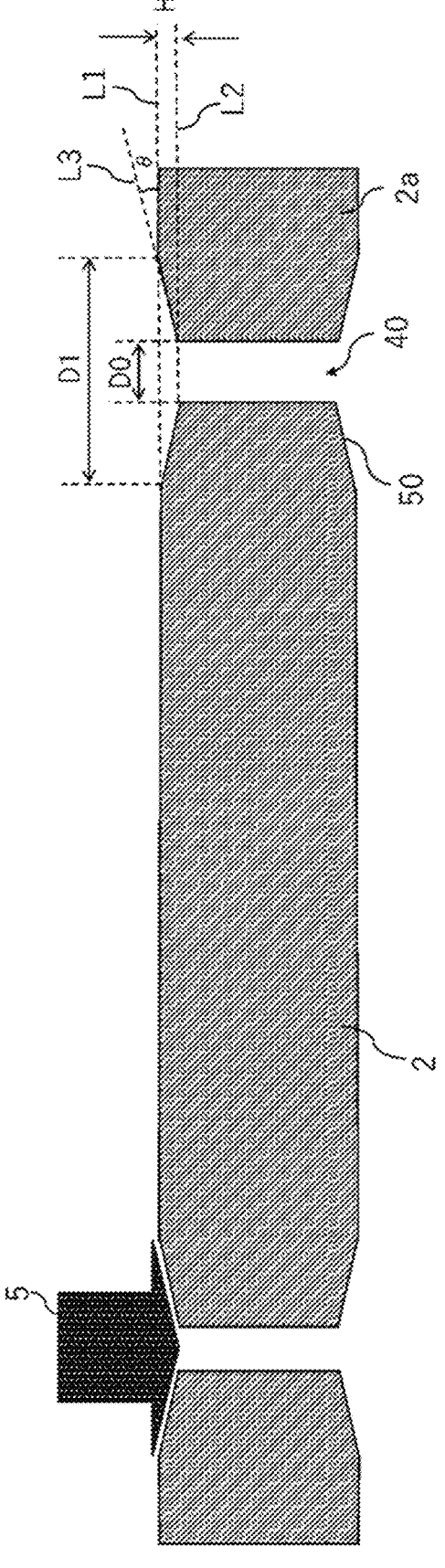

[Fig.5]
(a)
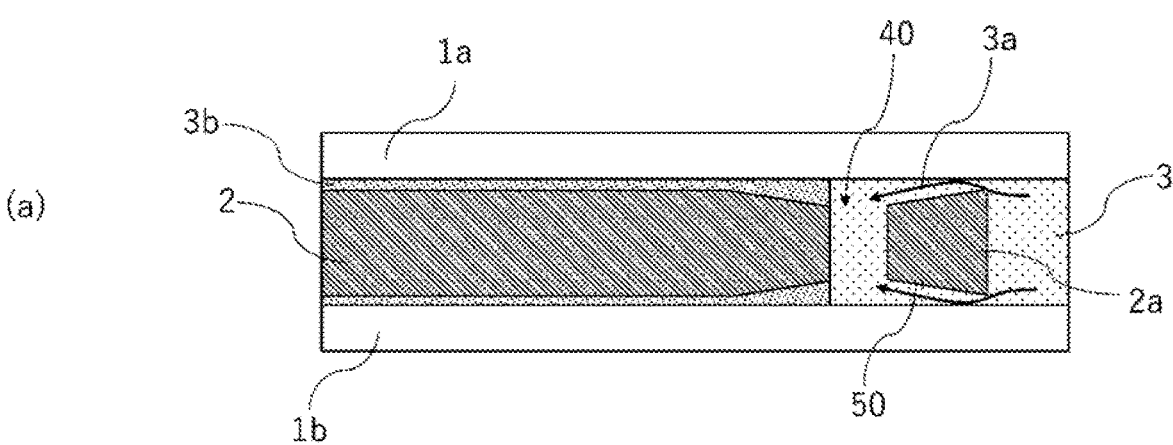
(b)
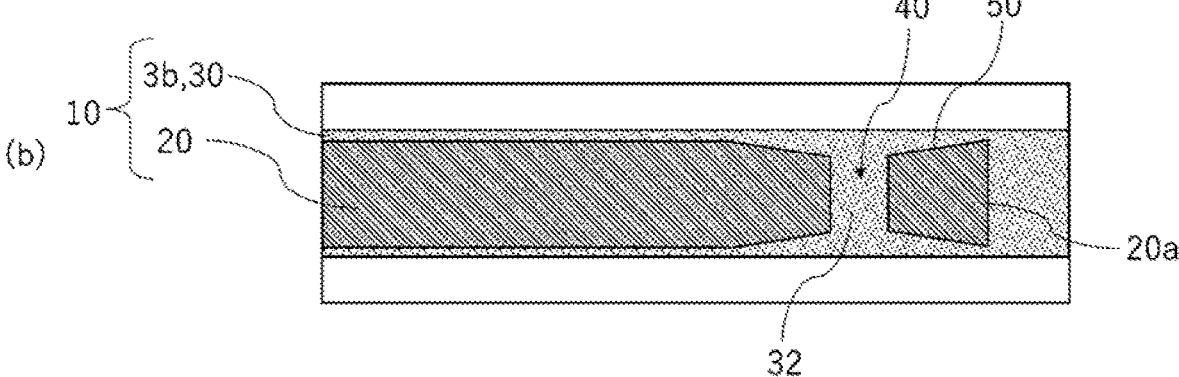

[Fig.6]
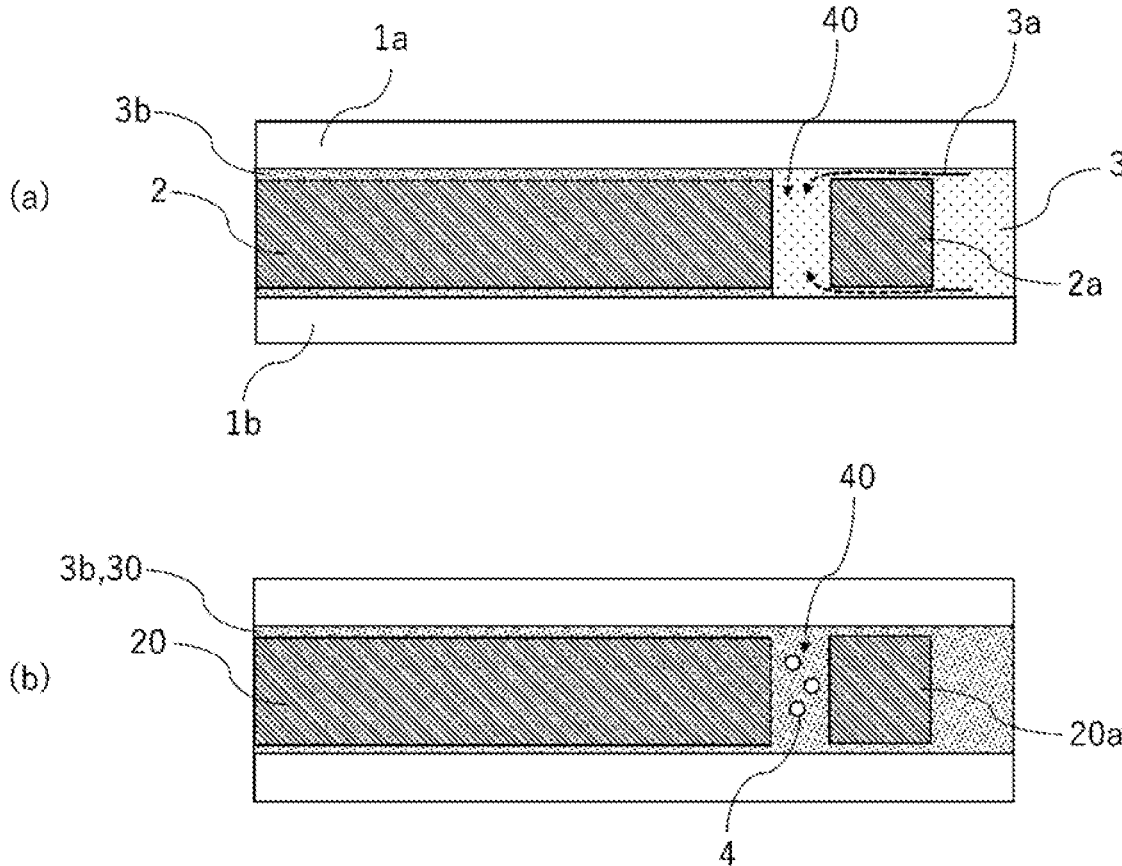

HEAT DISSIPATION MEMBER

TECHNICAL FIELD

The present invention relates to a heat dissipation member.

BACKGROUND ART

Various heat dissipation members have been developed until now. As this kind of technique, for example, a technique described in Patent Document 1 is known. Patent Document 1 discloses a plate-shaped heat dissipation component including: an Al—SiC composite main body portion that is formed by impregnating a porous silicon carbide body with aluminum; a fixing hole that penetrates the Al—SiC composite main body portion; and an aluminum coating layer that is formed on an inner surface of the fixing hole and the entire surface of an outer peripheral edge portion of the Al—SiC composite main body portion (for example, FIG. 2, paragraph 0012, etc., of Patent Document 1).

RELATED DOCUMENT

Patent Document

[Patent Document 1] Japanese Unexamined Patent Publication No. 2002-299532

SUMMARY OF THE INVENTION

Technical Problem

However, as a result of an investigation by the present inventors, it was found that the plate-shaped heat dissipation component described in Patent Document 1 has room for improvement from the viewpoint of screw fastening easiness.

Solution to Problem

As a result of thorough investigation based on this finding, the present inventors found that, by forming a screw hole in a metal portion containing aluminum in a through hole having a tapered portion, screw fastening easiness in the screw hole can be improved, thereby completing the present invention.

According to one aspect of the present invention, a heat dissipation member described below is provided.

1. A heat dissipation member that includes a flat metal-silicon carbide composite containing aluminum, the heat dissipation member including:
   at least one through hole that penetrates the flat metal-silicon carbide composite in a plate thickness direction;
   a tapered portion where an inner diameter of the through hole gradually increases toward an outer side in a periphery of one or both end portions of the through hole;
   a metal portion containing aluminum that is formed on an inner surface of the through hole; and
   a screw hole that is formed in the metal portion.
2. The heat dissipation member according to 1, in which an angle of the tapered portion is equal to or more than 0.2° and equal to or less than 7°.
3. The heat dissipation member according to 1 or 2, in which when a maximum hole diameter of the through hole is represented by D1 and a hole diameter of the screw hole is represented by D2, D2/D1 satisfies equal to or more than 0.1 and equal to or less than 0.9.
4. The heat dissipation member according to any one of 1 to 3, further including:
a plating layer that is formed on a surface of the metal portion in the screw hole.
5. The heat dissipation member according to 4, in which in a cross-sectional view of the through hole, when a thickness of the metal portion is represented by W1 and a thickness of the plating layer in the screw hole is represented by W2, W2/W1 satisfies equal to or more than 0.001 and equal to or less than 0.04.
6. The heat dissipation member according to any one of 1 to 5, further including:
a plating layer that is formed on a main surface side of the heat dissipation member.
7. The heat dissipation member according to 6, in which the plating layer is formed of a Ni plating layer containing Ni element.
8. The heat dissipation member according to any one of 1 to 7, further including:
a metal layer that is provided on a main surface of the heat dissipation member and contains aluminum.
9. The heat dissipation member according to any one of 1 to 8, in which an average thermal expansion coefficient of the heat dissipation member at 25° C. to 150° C. is equal to or more than 4 ppm/K and equal to or less than 12 ppm/K.
10. The heat dissipation member according to any one of 1 to 9, in which a thermal conductivity of the heat dissipation member in the plate thickness direction at 25° C. is equal to or more than 150 W/m·K and equal to or less than 300 W/m·K.

Advantageous Effects of Invention

According to the present invention, a heat dissipation member having excellent screw fastening easiness is provided.

BRIEF DESCRIPTION OF THE DRAWINGS

FIG. 1 is a diagram schematically showing an example of a heat dissipation member ((a) is a top view and (b) is a cross-sectional view).

FIG. 2 is a diagram (cross-sectional view) schematically showing an example of an electronic device.

FIG. 3 is a perspective view schematically showing an example of manufacturing steps of the heat dissipation member according to the present embodiment.

FIG. 4 is a cross-sectional view taken along arrow A-A of FIG. 3(c).

FIG. 5 is a cross-sectional view schematically showing an example of an impregnation step when a heat dissipation member has a tapered portion.

FIG. 6 is a cross-sectional view schematically showing an example of an impregnation step when a heat dissipation member has no tapered portion.

DESCRIPTION OF EMBODIMENTS

Hereinafter, an embodiment of the present invention will be described using the drawings. In all of the drawings, same components will be represented by same reference numerals, and the description thereof will be omitted where appropriate. In addition, the diagrams are schematic diagrams, in which a dimensional ratio does not match the actual one.

In the present specification, unless explicitly specified otherwise, the term "substantially" in the present specification is intended to include a range defined in consideration of manufacturing tolerances, assembly variations, and the like.

Unless specified otherwise, a value measured at room temperature (25° C.) can be adopted as a value that is variable depending on temperature among various numerical values (in particular, measured values) in the present specification.

In the present specification, "to" represents that an upper limit value and a lower limit value are included unless specified otherwise.

A heat dissipation member according to the present embodiment will be outlined.

The heat dissipation member according to the present embodiment is a heat dissipation member that includes a flat metal-silicon carbide composite containing aluminum, the heat dissipation member including: at least one through hole that penetrates the flat metal-silicon carbide composite in a plate thickness direction; a tapered portion where an inner diameter of the through hole gradually increases toward an outer side in a periphery of one or both end portions of the through hole; a metal portion containing aluminum that is formed on an inner surface of the through hole; and a screw hole that is formed in the metal portion.

FIG. 1(a) is a plan view schematically showing an example of a configuration of a heat dissipation member 10, and FIG. 1(b) is a cross-sectional view taken along arrow B-B of FIG. 1(a). In FIG. 1(a), an outer edge of a metal-silicon carbide composite 20 is indicated by a solid line, and an outer edge of a metal layer 30 is indicated by a dotted line.

The heat dissipation member 10 in (a) and (b) of FIG. 1 includes the metal-silicon carbide composite 20 that is formed by impregnating a porous silicon carbide body 2 with molten aluminum 3 and solidifying the porous silicon carbide body 2 in an impregnation step.

In the metal-silicon carbide composite 20, a screw hole 60 is formed in a metal portion 32 filled in a through hole 40 in the impregnation step.

The screw hole 60 is used for bonding the heat dissipation member 10 to another member (for example, a plastic case) using a screw or the like.

The screw hole 60 is formed of a metal portion 32b where an inner surface of the hole contains aluminum. The aluminum is a flexible metal material with which a thread groove can be more easily formed as compared to silicon carbide. Therefore, the screw or the like can be closely attached and fixed to a metal portion 32a, and thus the bond strength is improved. Accordingly, the screw hole 60 has a structure having excellent screw fastening easiness.

In addition, the screw hole 60 is formed such that a periphery of the metal portion 32b formed of the flexible metal material is covered with the porous silicon carbide body. Therefore, the screw hole 60 has a structure also having excellent mechanical strength.

FIG. 2 is a cross-sectional view schematically showing an example of a configuration of an electronic device 100.

The electronic device 100 of FIG. 2 has a structure where a screw 64 is inserted into the screw hole 60 and a case 80 is bonded to the heat dissipation member 10. Another member can be detachably fixed to the heat dissipation member 10 having the screw hole 60 using the screw 64.

A tapered portion 50 of FIG. 2 is formed in a periphery of both end portions of the through hole 40, and is configured such that an inner diameter of the through hole 40 gradually increases toward the outer side. The head of the screw 64 is fixed to the metal portion 32a on the tapered portion 50 in a closely attached state. The thickness of the metal portion 32a is thicker than that in case of a non-tapered structure, and the adhesiveness of the head of the screw 64 is improved. Therefore, the screw fastening easiness of the screw hole 60 in the through hole 40 can be improved.

On the other hand, a hole diameter D2 of the screw hole 60 is less than a maximum hole diameter (hole diameter D1) of the tapered portion 50. That is, a volume ratio of aluminum to silicon carbide in the vicinity of the through hole 40 can be reduced. Therefore, a decrease in mechanical strength of the metal-silicon carbide composite 20 can be suppressed. In addition, distortion caused by a difference in linear expansion coefficient between aluminum and silicon carbide can be suppressed.

FIG. 5 is a cross-section view showing an impregnation step when a taper forming step is provided.

FIG. 5 shows the impregnation step of impregnating the porous silicon carbide body 2 (preform) where the through hole 40 is formed with the molten aluminum 3.

In the impregnation step, typically, in an inner space of a mold, the porous silicon carbide body 2 interposed between spacers 1a and 1b is disposed, and heated molten aluminum, that is, the molten aluminum 3 is supplied. The supplied molten aluminum 3 is impregnated in the porous silicon carbide body 2. At this time, due to a difference in solidification latent heat, aluminum impregnated in the porous silicon carbide body 2 or aluminum present in the vicinity of the surface thereof is solidified first to form solidified aluminum 3b. As a result, a flow channel is blocked by the solidified aluminum 3b that is solidified first, and it is difficult for the molten aluminum 3 that is subsequently supplied to move in the porous silicon carbide body 2 or through the vicinity of the surface thereof.

The through hole 40 of FIG. 6(a) is formed using a general method such as drilling, and has a cylindrical structure having the same hole diameter without having the tapered portion in the plate thickness direction of the porous silicon carbide body 2.

FIG. 6(a) shows a state where a flow 3a of the molten aluminum 3 is inhibited by the solidified aluminum 3b that is solidified first. The reason for this is that the molten aluminum 3 cannot move in the porous silicon carbide body 2 where the solidified aluminum 3b is present and is not easy to pass through the vicinity of the surface in the periphery of the end portion of the through hole 40. Therefore, the supply amount of the molten aluminum 3 moving in the through hole 40 is insufficient. In this state, when the molten aluminum 3 in the through hole 40 is solidified, many cavities 4 are formed in the through hole 40 as shown in FIG. 6(b). In addition, occurrence of metal shrinkage during cooling is also considered to cause the formation of the cavities 4.

On the other hand, the through hole 40 of FIG. 5(a) includes the tapered portion 50 where the inner diameter of the through hole 40 gradually increases toward the outer side in the periphery of both end portions.

In FIG. 5(b), the tapered portion 50 in the through hole 40 functions as a flow channel that is not blocked by the solidified aluminum 3b that is solidified first. The molten aluminum 3 can move in the periphery of the end portions of the through hole 40 through the flow channel. As a result, the flow 3a of the supplied molten aluminum 3 is further improved as compared to FIG. 6(a). Accordingly, a sufficient amount of the molten aluminum 3 can be supplied into the through hole 40. In this state, when the molten aluminum 3 in the through hole 40 is solidified, the formation of the cavities 4 in the metal portion 32 of the through hole 40 can be suppressed as shown in FIG. 5(*b*).

In this way, the formation of the cavities 4 in the metal portion 32*b* of the through hole 40 is suppressed. Therefore, a screw thread formed on the surface of the metal portion 32*b* that is the inner surface of the screw hole 60 is not easy to be crushed during screw fastening.

Accordingly, in the heat dissipation member 10 according to the present embodiment, the fastening of the screw to the screw hole 60 is easy.

Hereinafter, each of steps in a method of manufacturing the heat dissipation member according to the present embodiment will be described in detail.

A method of manufacturing the heat dissipation member 10 according to the present embodiment will be described using FIGS. 3 to 5.

FIG. 3 is a perspective view schematically showing an example of the manufacturing steps of the heat dissipation member, FIG. 4 is a cross-sectional view taken along arrow A-A of FIG. 3(*c*), and FIG. 5 is a cross-sectional view schematically showing an example of the impregnation step.

In a preparation step, a flat porous silicon carbide body 2*b* of FIG. 3(*a*) is manufactured.

A method of manufacturing the porous silicon carbide body (SiC preform) is not particularly limited, and the porous silicon carbide body can be manufactured using a well-known method. For example, the porous silicon carbide body can be manufactured by adding silica, alumina, or the like as a binder to silicon carbide (SiC) powder as a raw material, mixing the components, molding and calcinating the mixture at equal to or higher than 800° C.

As a method of forming the porous silicon carbide body in a flat shape, a well-known method can be appropriately applied. For example, a well-known method such as a dry press method, a wet press method, an extrusion molding method, an injection method, a casting method, or a method of punching out after sheet-molding can be used.

It is preferable that the SiC content in the porous silicon carbide body is high because the thermal conductivity is high and the thermal expansion coefficient is low. It is noted that, when the content is excessively high, there is a case that the porous silicon carbide body is not sufficiently impregnated with an aluminum alloy.

In practice, suitably, the porous silicon carbide body contains equal to or higher than 40 mass % of coarse SiC particles having an average particle size of preferably equal to or more than 40 μm, and the relative density of the SiC preform is preferably in a range of equal to or higher than 55% and equal to or lower than 75%.

The bending strength of the porous silicon carbide body (SiC preform) is preferably equal to or higher than 3 MPa in order to prevent the porous silicon carbide body from fracturing during handling or impregnation. The average particle size can be measured by calculating the average value of particle sizes of 1000 particles using a scanning electron microscope (for example, "JSM-T200 model", manufactured by JEOL Ltd.) and an image analyzer (for example, manufactured by Nippon Avionics Co., Ltd.). In addition, the relative density can be measured by Archimedes method, etc.

It is preferable that the particle size of the SiC powder as a raw material of the porous silicon carbide body (SiC preform) is adjusted by, for example, appropriately using coarse powder and fine powder in combination. As a result, both the strength of the porous silicon carbide body (SiC preform) and the high thermal conductivity of the heat dissipation member that is finally obtained can be improved.

Specifically, mixed powder obtained by mixing (i) SiC coarse powder having an average particle size of equal to or more than 40 μm and equal to or less than 150 μm and (ii) SiC fine powder having an average particle size of equal to or more than 5 μm and equal to or less than 15 μm is suitable. Here, regarding a ratio between the amount of (i) and the amount of (ii) in the mixed powder, the amount of (i) is preferably equal to or higher than 40 mass % and equal to or lower than 80 mass %, and the amount of (ii) is preferably equal to or higher than 20 mass % and equal to or lower than 60 mass %.

The porous silicon carbide body (SiC preform) is obtained by, for example, degreasing and calcinating a compact of a mixture obtained by adding the binder to the SiC powder. When the calcination temperature is equal to or higher than 800° C., a porous silicon carbide body (SiC preform) having a bending strength of equal to or higher than 3 MPa is likely to be obtained irrespective of the atmosphere during the calcination.

It is noted that, in an oxidizing atmosphere, when the calcination is performed at a temperature exceeding 1100° C., oxidation of SiC is promoted, and there is a case that the thermal conductivity of the metal-silicon carbide composite decreases. Accordingly, it is preferable that the calcination is performed at a temperature of equal to or lower than 1100° C. in the oxidizing atmosphere.

The calcination time may be appropriately determined depending on conditions such as the size of the porous silicon carbide body (SiC preform), the amount of raw materials charged into a calcination furnace, or the calcination atmosphere.

When the porous silicon carbide body (SiC preform) is molded in a predetermined shape, a change in curve caused by drying can be prevented by performing drying the SiC preforms one by one or by performing drying the SiC preforms using a spacer such as carbon having the same shape as the preform shape between the SiC preforms. In addition, by performing the same process as that during drying for the calcination, a shape change caused by a change in internal structure can be prevented.

As necessary, at least a single surface of the porous silicon carbide body (SiC preform) is processed in a convex curved shape toward the outer side by, for example, a cutting and grinding tool such as a lathe. Both surfaces of the porous silicon carbide body (SiC preform) may be processed instead of the single surface.

In this way, by performing mechanical processing (cutting) at a stage of the preform, it is not necessary to use, for example, a special tool for cutting after the metal impregnation, and there is an advantageous effect in that the degree of curve or the flatness is easy to control.

In the preparation step, as necessary, the outer periphery of the porous silicon carbide body 2*b* is processed to form the porous silicon carbide body 2 of FIG. 3(*b*) having a desired outer peripheral structure. Specifically, in at least four corners of the porous silicon carbide body 2, a cut-out portion 22 obtained by excluding a part of the porous silicon carbide body 2 may be formed.

As the outer periphery processing, for example, typical mechanical processing, grinding, water-jet machining, laser processing, or electric discharge machining is used, but the present invention is not limited thereto.

Next, in a hole forming step, the through hole 40 that penetrates the flat porous silicon carbide body 2 in the plate thickness direction is formed. A plurality of the through hole 40 of FIG. 3(*b*) are formed in a peripheral edge portion of the porous silicon carbide body 2. Specifically, it is preferable that the through holes 40 are provided in at least four corners of the porous silicon carbide body 2.

By mechanical processing such as drilling, the through hole 40 can be formed.

Next, in the taper forming step, the tapered portion 50 of FIG. 3(*c*) is formed in one or both end portions of the through hole 40. Specifically, it is preferable that the tapered portions 50 are provided in each of both end portions of all the through holes 40.

In a taper machining method, as shown in FIG. 4, a tool for taper machining (tool 5) having a predetermined angle is used, and the amount of depression of the tool 5 or the angle of the tool 5 is adjusted. As a result, the hole diameter D1 (taper diameter) of the tapered portion 50 or a height H (taper height) of the tapered portion 50 can be controlled. In addition, the angle θ (taper angle) of the tapered portion 50 can be controlled based on the hole diameter D1 and the height H.

By adjusting the taper diameter and the taper height and/or the taper angle, the formation of the cavities in the through hole 40 during the metal impregnation in the metal-silicon carbide composite 20 can be suppressed.

Here, the taper diameter (hole diameter D1) is defined as the maximum diameter of the through hole 40 in the plate thickness direction in one cross-sectional view of the heat dissipation member 10 of FIG. 2.

A hole diameter D0 of the through hole 40 is defined as the minimum diameter of the through hole 40 in the plate thickness direction in one cross-sectional view of the heat dissipation member 10 of FIG. 2.

The taper diameter is, for example, +6 to +40 mm, preferably +8 to +36 mm, and more preferably +10 to +32 mm with respect to the minimum hole diameter (hole diameter D0) of the through hole 40.

Alternatively, the taper diameter may be configured such that the hole diameter D1/the hole diameter D0 satisfies, for example, 1.5 to 16, preferably 2 to 15, and more preferably 2.3 to 14.

For example, the hole diameter D0 of the through hole 40 can be appropriately selected depending on the area or use of the flat porous silicon carbide body 2, and is, for example, 4 to 10 mm, preferably 5 to 9 mm, and more preferably 6 to 9 mm.

In one cross-sectional view of the heat dissipation member 10 of FIG. 2, the taper height is defined as the distance (height H) between an auxiliary line L1 drawn to pass through the end portion of the tapered portion 50 on the surface side where the through hole 40 has the maximum diameter and an auxiliary line L2 drawn to pass through the end portion of the tapered portion 50 on the inner side where the through hole 40 has the minimum diameter. This auxiliary line L1 may be formed along a main surface of the porous silicon carbide body 2.

The taper height (height H) is, for example, 0.1 to 1 mm, preferably 0.2 to 0.8 mm, and more preferably 0.3 to 0.6 mm.

In one cross-sectional view of the heat dissipation member 10 of FIG. 2, the taper angle is defined as the angle (θ) between the auxiliary line L1 and an auxiliary line L3 drawn along a tapered surface of the tapered portion 50.

The taper angle (θ) is, for example, 0.2 to 7°, preferably 0.3 to 6°, and more preferably 0.4 to 5°.

By adjusting the taper angle to be equal to or less than the upper limit value, a decrease in the mechanical strength of the metal-silicon carbide composite 20 can be suppressed. In addition, distortion caused by a difference in linear expansion coefficient between aluminum and silicon carbide can be suppressed. In addition, by adjusting the taper angle to be equal to or more than the lower limit value, the manufacturing stability of the heat dissipation member 10 can be improved.

The shape of the tapered portion 50 is not particularly limited as long as it functions as a flow channel of the molten aluminum 3.

When seen from a direction perpendicular to the main surface of the porous silicon carbide body 2 (hereinafter, also referred to as a main surface-perpendicular direction), the shape of the tapered portion 50 may have a ring shape to surround the periphery of the through hole 40. However, the present invention is not limited to this configuration. The outer edge shape of the tapered portion 50 may be formed in a circular shape such as a perfect circle or an ellipse, a polygonal shape such as a quadrangle or a hexagon.

In addition, when seen from the main surface-perpendicular direction, the tapered portion 50 may have a plurality of separator portions that are separated from each other. That is, the tapered portion 50 may have two or more flow channels of the molten aluminum 3 that are separately provided.

In addition, when seen from the main surface-perpendicular direction, a part of the tapered portion 50 may have an extension portion that protrudes from another portion toward the outer edge side. The outer edge or the extension portion of the tapered portion 50 may reach the outer peripheral edge of the porous silicon carbide body 2, and is preferably present inside the outer peripheral edge from the viewpoint of the mechanical strength.

In a cross-sectional view of the porous silicon carbide body 2, the tapered surface of the tapered portion 50 may be linear or curved, and may have one or two or more step portions or groove portions in the surface. Specifically, in a cross-sectional view of the porous silicon carbide body 2, the tapered surface of FIG. 2 may be linear. As a result, the flow 3a of the molten aluminum 3 is improved.

Next, in the impregnation step, inside of the flat porous silicon carbide body 2 is impregnated with a metal containing aluminum to obtain the metal-silicon carbide composite 20.

First, in FIG. 5(*a*), the porous silicon carbide body 2 in a state where both surfaces are interposed between the spacers 1a and 1b is set to a mold, and subsequently molten metal (metal containing aluminum) is charged into the mold. By pressing the molten metal, voids of the porous silicon carbide body 2 are impregnated with the metal, and the metal is filled in the through hole 40. In FIG. 5(*b*), the metal-silicon carbide composite 20 containing aluminum is obtained through cooling. At this time, in the through hole 40, the metal is cooled, and the metal portion 32 is filled.

The spacers 1a and 1b are not particularly limited as long as they can release the obtained metal-silicon carbide composite 20. A laminate structure of the porous silicon carbide body where another porous silicon carbide body and another spacer are further disposed on the spacer 1a may be used for the impregnation step.

Here, when the porous silicon carbide body 2 is set to the mold, it is preferable to preheat the mold. The preheating temperature is, for example, equal to or higher than 500° C. and equal to or lower than 650° C. In order to prevent a temperature decrease, it is preferable that the molten metal is charged as rapidly as possible after setting the porous silicon carbide body (SiC preform) to the mold.

When the porous silicon carbide body 2 (SiC preform) is impregnated with the metal to obtain the metal-silicon carbide composite 20, a surface metal layer (metal layer 30) may be provided on the surface (for example, the main surface) of the metal-silicon carbide composite 20. As a result, the metal layer 30 containing aluminum can be formed on one surface or both surfaces of the metal-silicon carbide composite 20.

For example, a mold having a slightly larger dimension than the dimension of the SiC preform is prepared as the mold for the impregnation, the SiC preform is disposed in the mold, and the molten metal is poured thereinto. As a result, the surface metal layer can be provided.

In another example, the surface metal layer can also be provided by impregnating the SiC preform with the metal in a state where one or more kinds among fibers, spherical particles, and crushed particles formed of alumina or silica are disposed to be in direct contact with the surface of the SiC preform. At this time, the content of the material containing one or more kinds among fibers, spherical particles, and crushed particles formed of alumina or silica in the surface metal layer is preferably equal to or higher than 0.1 mass % and equal to or lower than 5 mass % and more preferably equal to or higher than 0.3 mass % and equal to or lower than 2 mass % with respect to the mass of the metal-silicon carbide composite.

In still another example, the surface metal layer can be provided using a method of disposing a thin sheet or a thin film of the metal on the surface of the SiC preform and impregnating the SiC preform with the metal, a method of providing a groove or the like on the surface of the preform in advance, or the like.

The press pressure of the molten metal is not particularly limited as long as the metal can be sufficiently impregnated, and is, for example, equal to or higher than 30 MPa.

It is preferable that the melting point of the metal (preferably, aluminum or an alloy containing aluminum) to be impregnated is appropriately low so as to sufficiently permeate into the voids of the preform.

From this viewpoint, for example, an aluminum alloy containing equal to or higher than 7 mass % and equal to or lower than 25 mass % of silicon is preferable. Further, it is preferable that the aluminum alloy further contains equal to or higher than 0.2 mass % and equal to or lower than 5 mass % of magnesium from the viewpoint that the binding between the silicon carbide powder and the metal portion becomes stronger. Metal components in the aluminum alloy other than aluminum, silicon, and magnesium are not particularly limited within a range where characteristics of the aluminum alloy do not change extremely. For example, copper may be contained.

As the aluminum alloy, for example, AC4C, AC4CH, or ADC12 that is an alloy for forging can be preferably used.

Incidentally, in order to remove distortion generated during the impregnation, an annealing treatment may be performed on the metal-silicon carbide composite 20. The annealing treatment can be performed, for example, under conditions of a temperature of about equal to or higher than 400° C. and equal to or lower than 550° C. and 10 minutes or longer.

As a result, the heat dissipation member 10 according to the present embodiment can be obtained.

Of course, the method of manufacturing the heat dissipation member according to the present embodiment is not limited to the above-described configuration.

For example, in the heat dissipation member 10 according to the present embodiment, the surface metal layer is an optional configuration. Therefore, the surface metal layer does not need to be formed.

In addition, a step of polishing or blasting the surface of the obtained heat dissipation member 10 may be performed.

In addition, in the obtained heat dissipation member 10, a step of forming the screw hole may be provided after the impregnation step.

In the screw hole forming step, in FIG. 5(b), the screw hole is formed in the metal portion 32 formed by filling aluminum in the through hole 40.

The heat dissipation member 10 of FIG. 1(b) includes the screw 64 formed in the metal portion 32b of the through hole 40. The screw 64 has a screw thread that is a non-through hole and is formed on the inner surface.

In a cross-sectional view of the heat dissipation member 10, the hole diameter of the screw 64 is represented by D2, and the maximum hole diameter of the through hole 40 is represented by D1.

D2/D1 is, for example, 0.1 to 0.9, preferably 0.15 to 0.7, and more preferably 0.2 to 0.6.

In addition, in the obtained heat dissipation member 10, a plating step may be provided after the impregnation step. For example, a plating layer can be provided on the main surface side of the heat dissipation member 10 using a well-known method of electroless Ni—P plating or Ni—B plating.

The heat dissipation member 10 may further include the plating layer that is formed on the surface of the metal portion 32b in a screw hole 62 of FIG. 1(b).

At this time, in a cross-sectional view of the through hole 40, a thickness of the metal portion 32b is represented by W1, and a thickness of the plating layer in the screw hole 62 is represented by W2.

W2/W1 is, for example, 0.001 to 0.04, preferably 0.002 to 0.03, and more preferably 0.003 to 0.02.

The heat dissipation member 10 according to the present embodiment will be described in detail.

The heat dissipation member 10 in (a) and (b) of FIG. 1 includes the flat metal-silicon carbide composite 20 and the metal layer 30 that is formed on at least both front and back surfaces of the metal-silicon carbide composite 20.

Among both of the two surfaces of the heat dissipation member 10, a surface on a side where an electronic component is mounted is represented by a main surface 30A, and another surface thereof is represented by a back surface 30B.

In one aspect, the main surface 30A and/or the back surface 30B (that is, the surface of the heat dissipation member 10) may be the metal-silicon carbide composite 20 containing aluminum.

In another aspect, the main surface 30A and/or the back surface 30B (the surface of the heat dissipation member 10) may be the metal layer 30. For example, it is preferable that the main surface 30A and/or the back surface 30B of the heat dissipation member 10 includes the metal layer 30 (surface metal layer) containing aluminum. In this case, a portion of the heat dissipation member 10 other than the surface metal layer can be the metal-silicon carbide composite or the like.

The heat dissipation member 10 of FIG. 1(a) has a plurality of screw holes 62 (through holes) in the peripheral edge portion thereof. More specifically, when the heat dissipation member 10 is substantially rectangular as described below, it is preferable that the screw holes 62 are provided in metal layers 30a formed in the cut-out portions 22 of at least four corners of the heat dissipation member 10.

The screw hole 62 is used for bonding the heat dissipation member 10 to another heat dissipation component (for example, a heat dissipation fin) using a screw or the like.

The electronic component can be, for example, a power semiconductor element. A large amount of heat is emitted from an electronic element 90 that is a power semiconductor element. By appropriately bonding the heat dissipation member 10 (substrate for mounting an element) according to the present embodiment to another heat dissipation member (for example, a heat dissipation fin), the heat can be efficiently dissipated.

The electronic element 90 includes at least a ceramic substrate 92. In FIG. 2, the electronic element 90 has a structure where the ceramic substrate 92 is interposed between two metal layers 13.

The electronic element 90 is mounted on a main surface 3A side of the heat dissipation member 10, for example, by being soldered by a solder 70. When the electronic element 90 is seen in a top view where the main surface 3A of the heat dissipation member 10 is the top surface, 10 to 80% of the area of the heat dissipation member 10 is covered with the electronic element 90.

The heat dissipation member 10 is preferably substantially rectangular. That is, the shape of the heat dissipation member 10 is substantially rectangular when seen from a direction perpendicular to the main surface 30A of the heat dissipation member 10.

Here, "being substantially rectangular" represents that at least one of four corners of the heat dissipation member 10 may have a slightly rounded shape without being linear (of course, the four corners may be linear).

When at least one of the four corners of the heat dissipation member 10 is processed in a rounded shape, an intersection point when straight line portions of a short side and a long side of the heat dissipation member 10 in the top view are extended can be defined as "vertex" of the rectangle. In addition, at this time, "the length of the short side" or "the length of the long side" of the heat dissipation member 10 can be defined by using the above-described "vertex" as a starting point or an end point.

The vertical and horizontal lengths of the heat dissipation member 1 are, for example, about in a range of 40 mm×90 mm to 140 mm×250 mm.

The thickness of the heat dissipation member 1 is, for example, equal to or more than 2 mm and equal to or less than 6 mm and preferably equal to or more than 3 mm and equal to or less than 5 mm. When the thickness of the heat dissipation member 1 is not uniform, it is preferable that at least the thickness of a center-of-gravity portion of the heat dissipation member 1 is in the above-described range. In addition, when the thickness of the heat dissipation member 1 is not uniform, the thickness of each of portions other than the hole is preferably within the above-described range.

An average thermal expansion coefficient of the heat dissipation member 10 at 25° C. to 150° C. is, for example, 4 to 12 ppm/K and preferably 4 to 10 ppm/K. As a result, cracking, fracturing, or the like caused by a difference in thermal expansion coefficient from the ceramic plate can be suppressed.

As the linear thermal expansion coefficient, a value during a temperature decrease from 150° C. to 25° C. is used. The linear thermal expansion coefficient can be measured by a thermal expansion meter according to JIS R1618 under a condition of a temperature decrease rate of equal to or lower than 5° C./min.

The thermal conductivity of the heat dissipation member 10 in the plate thickness direction at 25° C. is, for example, 150 to 300 W/m·K and preferably 180 to 300 W/m·K.

The metal in the metal-silicon carbide composite 20 may be, for example, aluminum, an aluminum alloy, magnesium, or a magnesium alloy. From the viewpoint of the thermal conductivity, it is preferable that the metal-silicon carbide composite 20 contains aluminum or an aluminum alloy.

In addition, examples of the alloy include an aluminum alloy containing 7 to 25 mass % of silicon (Si). By using the aluminum alloy containing 7 to 25 mass % of silicon, an effect of promoting densification of the metal-silicon carbide composite 20 can be obtained.

When the metal-silicon carbide composite 20 is an aluminum-silicon carbide composite, aluminum is contained as a main component, and the content of aluminum in the metal is, for example, 60 to 100 mass % and may be 80 to 99.8 mass %.

In addition to aluminum as the main component, the metal in the aluminum-silicon carbide composite may contain one or two or more elements selected from the group consisting of magnesium, silicon, iron, and copper as long as the effect of the present invention does not deteriorate.

The metal in the metal layer 30 may be the same as the metal contained in the metal-silicon carbide composite 20, for example, aluminum, an aluminum alloy, magnesium, or a magnesium alloy.

The thickness of the metal layer 30 is, for example, 10 to 300 μm and preferably 30 to 150 μm.

By adjusting the thickness of the metal layer 30 to be equal to or more than the lower limit value, the film strength of the metal layer 30 can be improved. By adjusting the thickness of the metal layer 30 to be equal to or less than the upper limit value, occurrence of warpage caused by a difference in thermal expansion coefficient from the metal-silicon carbide composite 20 can be suppressed.

The thermal conductivity can be measured using a laser flash method according to JIS R1611.

The material of the ceramic substrate 92 in the electronic component is not particularly limited as long as it is a ceramic material.

Examples of the material of the ceramic substrate 92 include a nitride ceramic such as silicon nitride or aluminum nitride, an oxide ceramic such as aluminum oxide or zirconium oxide, a carbide ceramic such as silicon carbide, and a boride ceramic such as lanthanum boride. Among these, aluminum nitride, silicon nitride, and aluminum oxide are preferable from the viewpoints of insulation properties, the strength of bonding to the metal layer 13, mechanical strength, and the like.

As a brazing material that bonds the metal layer 30 and the ceramic substrate 92 to each other, an Ag—Cu-based brazing material is preferable. That is, the brazing material is preferably a mixture of Ag powder, Cu powder, and the like.

The brazing material may contain Sn or In, for example, in order to improve wettability with the ceramic plate or the like.

It is preferable that the brazing material contains active metal, for example, from the viewpoint of increasing reactivity with the ceramic plate. Examples of the active metals include titanium, zirconium, hafnium, and niobium. It is preferable that the brazing material contains titanium from the viewpoint of improving reactivity with an aluminum nitride substrate and a silicon nitride substrate and significantly improving the bond strength to them.

In addition, the type of the solder 70 is not particularly limited and, for example, a lead-tin eutectic solder or a lead-free solder can be used.

Although not shown in FIG. 1, the heat dissipation member 10 may include a plating layer that is formed on the main surface 30A side of the heat dissipation member 10, specifically, the outermost surface. As a result, the solder bondability can be improved.

The plating layer may contain at least one of Ni, Au, and Ag. In particular, it is preferable that the plating layer is formed of an Ni plating layer containing Ni.

The thickness of the plating layer is, for example, 3 to 15 μm and preferably 4 to 10 μm.

By adjusting the thickness of the plating layer to be equal to or more than the lower limit value, the film stability of the plating layer can be improved. By adjusting the thickness of the plating layer to be equal to or less than the upper limit value, occurrence of warpage caused by a difference in thermal expansion coefficient from an underlayer such as the metal layer 30 can be suppressed.

Hereinafter, the embodiment of the present invention has been described. However, the embodiment is merely an example of the present invention, and various configurations other than the above-described configurations can be adopted. In addition, the present invention is not limited to the above-described embodiments, and modifications, improvements, and the like within a range where the object of the present invention can be achieved are included in the present invention.

EXAMPLES

Hereinafter, the present invention will be described in detail with reference to Examples. However, the present invention is not limited to the description of these Examples.

<Manufacturing of Heat Dissipation Member>

(Formation of Porous Silicon Carbide Body)

First, silicon carbide powder A, silicon carbide powder B, and silica sol described below were mixed with each other using a stirring mixer for 30 minutes to obtain a mixture.

Silicon carbide powder A (manufactured by Pacific Rundum Co., Ltd.: NG-150, average particle size: 100 μm) 300 g Silicon carbide powder B (manufactured by Yakushima Denko Co., Ltd.: GC-1000F, average particle size: 10 μm) 150 g Silica sol (manufactured by Nissan Chemical Operation: SNOWTEX) 30 g The obtained mixture was put into a mold and was pressed at a pressure of 10 MPa. As a result, a flat compact having a dimension of 135 mm×75 mm×5.0 mm was obtained. The obtained compact was calcinated in air at a temperature of 900° C. for 2 hours to obtain a porous silicon carbide body having a relative density (bulk density) of 65 vol %.

(Through Hole/Tapered Portion Forming Step)

Through holes were formed by drilling at four corners of the porous silicon carbide body.

Next, the tool for taper machining (tool 5) having the predetermined angle of FIG. 4 was pressed against both ends of each of the through holes to form the tapered portion.

The dimensions of the tapered portions of Examples 1 and 2 are shown in Table 1 below. In Comparative Example 1, the tapered portion was not formed.

The diameter of the through hole in Table 1 refers to the minimum hole diameter (DO).

(Impregnation with Metal)

Both surfaces of the mechanically processed porous silicon carbide body were interposed between carbon-coated stainless steel plates having a dimension of 170 mm×100 mm×0.8 mm, and were laminated.

Next, steel plates having a thickness of 6 mm were disposed on the both sides and were fastened by six M10 bolts in a state that they were lined to each other using a torque wrench such that the fastening torque in a planar direction was 2 Nm. As a result, one block was obtained.

Next, the integrated block was preheated to 620° C. in an electric furnace and subsequently was put into a press mold having an inner diameter of 400 mmφ that was heated in advance. Molten aluminum alloy containing 12 mass % of silicon and 1.0 mass % of magnesium was poured into the press mold, and the mold was pressurized at a pressure of 60 MPa for 20 minutes. As a result, the porous silicon carbide body was impregnated with the aluminum alloy.

After completion of the impregnation, the block was cooled to 25° C. and was cut along a shape of the stainless steel plates using a wet bandsaw to remove the interposed stainless steel plates. Further, next, in order to remove distortion during the impregnation, an annealing treatment was performed at a temperature of 500° C. for 3 hours.

As a result, an aluminum-silicon carbide composite was obtained.

(Treatment after Impregnation)

The outer periphery of the obtained aluminum-silicon carbide composite was processed with an NC lathe such that the vertical and horizontal lengths were 140 mm×80 mm.

Next, a screw hole (hole diameter D2: 4 mm) was formed in the metal portion formed in the through hole of the aluminum-silicon carbide composite.

As a result, a heat dissipation member including no plating layer was obtained.

(Evaluation of Cavities)

Each of the obtained heat dissipation members was cut, and the inner surface of the through hole was observed with an optical microscope whether or not cavities (streaks such as single or connected air bubbles) occurred in a surface image at 50-fold.

In addition, when the number of images (number of inspections) in other observed regions is represented by Ni and the number of images (number of occurrences) where the cavities are observed is represented by N2, the cavity occurrence rate was calculated based on the expression: N2/N1×100% and was shown in Table 1.

(Screw Fastening Easiness)

Using each of the obtained heat dissipation members, the workability when the screw was fastened to the screw hole was evaluated.

In Comparative Example 1, in some of the four screw holes, the screw thread was crushed such that the screw was not able to be fastened (Bad).

In Examples 1 and 2, in the four screw holes, the screw thread was less likely to be crushed as compared to Comparative Example 1, and the screw was able to be easily fastened (Good).

TABLE 1

|  | Through Hole | Taper Diameter (D1) | Taper Height (H) | Taper Angle (θ) | Cavity Occurrence Rate | Screw Fastening Easiness |
|---|---|---|---|---|---|---|
| Comparative Example 1 | 6 mm | No Tapered Portion | — | — | 78% | Bad |
| Example 2 | 6 mm | 16 mm | 0.3 mm | 4.6° | 50% | Good |
| Example 1 | 9 mm | 49 mm | 0.5 mm | 1.4° | 18% | Good |

It was found that, in the heat dissipation members according to Examples 1 and 2, the screw thread was less likely to be crushed as compared to Comparative Example 1, and the screw was able to be easily fastened to the screw hole.

The present application claims priority based on Japanese Patent Application No. 2021-164568 filed on Oct. 6, 2021, the entire content of which is incorporated herein by reference.

REFERENCE SIGNS LIST

1a: spacer
1b: spacer
2: porous silicon carbide body (preform)
2a: porous silicon carbide body
2b: porous silicon carbide body
3: molten aluminum
3a: flow
3b: solidified aluminum
4: cavity
5: tool
10: heat dissipation member
20: metal-silicon carbide composite
20a: metal-silicon carbide composite
22: cut-out portion
30: metal layer
30a: metal layer
30A: main surface
30B: back surface
32: metal portion
32a: metal portion
32b: metal portion
40: through hole
50: tapered portion
60: screw hole
62: screw hole
64: screw
70: solder
80: case
90: electronic element
92: ceramic substrate
100: electronic device

The invention claimed is:

1. A heat dissipation member that includes a flat metal-silicon carbide composite containing aluminum, the heat dissipation member comprising:

at least one through hole that penetrates the flat metal-silicon carbide composite in a plate thickness direction;

a tapered portion where an inner diameter of the through hole gradually increases toward an outer side in a periphery of one or both end portions of the through hole;

a metal portion containing aluminum that is formed on an inner surface of the through hole; and a screw hole that is formed in the metal portion;

wherein an angle of the tapered portion is equal to or more than 0.2° and equal to or less than 7°.

2. The heat dissipation member according to claim 1, wherein when a maximum hole diameter of the through hole is represented by D1 and a hole diameter of the screw hole is represented by D2, D2/D1 satisfies equal to or more than 0.1 and equal to or less than 0.9.

3. The heat dissipation member according to claim 1, further comprising:

a plating layer that is formed on a surface of the metal portion in the screw hole.

4. The heat dissipation member according to claim 3, wherein in a cross-sectional view of the through hole, when a thickness of the metal portion is represented by W1 and a thickness of the plating layer in the screw hole is represented by W2, W2/W1 satisfies equal to or more than 0.001 and equal to or less than 0.04.

5. The heat dissipation member according to claim 1, further comprising:

a plating layer that is formed on a main surface side of the heat dissipation member.

6. The heat dissipation member according to claim 5, wherein the plating layer is formed of a Ni plating layer containing Ni element.

7. The heat dissipation member according to claim 1, further comprising:

a metal layer that is provided on a main surface of the heat dissipation member and contains aluminum.

8. The heat dissipation member according claim 1, wherein an average thermal expansion coefficient of the heat dissipation member at 25° C. to 150° C. is equal to or more than 4 ppm/K and equal to or less than 12 ppm/K.

9. The heat dissipation member according to claim 1, wherein a thermal conductivity of the heat dissipation member in a plate thickness direction at 25° C. is equal to or more than 150 W/m·K and equal to or less than 300 W/m·K.

* * * * *